United States Patent [19]
Murakami

[11] Patent Number: 5,479,167
[45] Date of Patent: Dec. 26, 1995

[54] CHARACTER CODE CONVERSION UNIT

[75] Inventor: Takashi Murakami, Kawasaki, Japan

[73] Assignee: Fujitsu Limited, Kawasaki, Japan

[21] Appl. No.: 298,292

[22] Filed: Aug. 31, 1994

[30] Foreign Application Priority Data

Dec. 20, 1993 [JP] Japan .................. 5-319344

[51] Int. Cl.$^6$ .................................. H03M 7/00
[52] U.S. Cl. ........................................... 341/90
[58] Field of Search .................. 341/90, 55, 99, 341/88; 395/200, 325, 600

[56] References Cited

U.S. PATENT DOCUMENTS

4,580,242  4/1986  Suzuki et al. .................. 364/900

Primary Examiner—Brian K. Young
Attorney, Agent, or Firm—Staas & Halsey

[57] ABSTRACT

A character code conversion unit inputs data to a common file that both uses the second code and also is utilized by a plurality of systems, the character code conversion unit being equipped with a code converter and a unit for determining the conversion into another code system. The code converter converts the character data expressed by a first code system into character data expressed by a second code system, and holds the converted results when they are properly converted. The unit for determining the conversion into another code system inputs the data of the first code system and determines whether the data can be converted into data of a third code system, different from both the first code system and the second code system. When the data are properly converted, the converted results held in the code converter are output.

4 Claims, 6 Drawing Sheets

|    | 00 | 01 | 02 | 03 | 04 | 05 | 06 | 07 | 08 | 09 | 0a | 0b | 0c | 0d | 0e | 0f |
|----|----|----|----|----|----|----|----|----|----|----|----|----|----|----|----|----|
| 00 | 00 | 00 | 00 | 00 | 00 | 00 | 00 | 00 | 00 | 00 | 00 | 00 | 00 | 00 | 00 | 00 |
| 10 | 00 | 00 | 00 | 00 | 00 | 00 | 00 | 00 | 00 | 00 | 00 | 00 | 00 | 00 | 00 | 00 |
| 20 | 40 SP | 5a ! | 7f " | 7b # | e0 $ | 6c % | 50 & | 7d ' | 4d ( | 5d ) | 5c * | 4e + | 6b , | 60 − | 4b . | 61 / |
| 30 | f0 0 | f1 1 | f2 2 | f3 3 | f4 4 | f5 5 | f6 6 | f7 7 | f8 8 | f9 9 | 7a : | 5e ; | 4c < | 7e = | 6e > | 6f ? |
| 40 | 7c @ | c1 A | c2 B | c3 C | c4 D | c5 E | c6 F | c7 G | c8 H | c9 I | d1 J | d2 K | d3 L | d4 M | d5 N | d6 O |
| 50 | d7 P | d8 Q | d9 R | e2 S | e3 T | e4 U | e5 V | e6 W | e7 X | e8 Y | e9 Z | 4a [ | 5b ¥ | 6a ] | 5f ^ | 6d _ |
| 60 | 79 ` | 81 a | 82 b | 83 c | 84 d | 85 e | 86 f | 87 g | 88 h | 89 i | 91 j | 92 k | 93 l | 94 m | 95 n | 96 o |
| 70 | 97 p | 98 q | 99 r | a2 s | a3 t | a4 u | a5 v | a6 w | a7 x | a8 y | a9 z | c0 { | 4f \| | d0 } | d1 ~ | 00 |
| 80 | 00 | 00 | 00 | 00 | 00 | 00 | 00 | 00 | 00 | 00 | 00 | 00 | 00 | 00 | 00 | 00 |
| 90 | 00 | 00 | 00 | 00 | 00 | 00 | 00 | 00 | 00 | 00 | 00 | 00 | 00 | 00 | 00 | 00 |
| A0 | 00 | 00 | 00 | 00 | 00 | 00 | 00 | 00 | 00 | 00 | 00 | 00 | 00 | 00 | 00 | 00 |
| B0 | 00 | 00 | 00 | 00 | 00 | 00 | 00 | 00 | 00 | 00 | 00 | 00 | 00 | 00 | 00 | 00 |
| C0 | 00 | 00 | 00 | 00 | 00 | 00 | 00 | 00 | 00 | 00 | 00 | 00 | 00 | 00 | 00 | 00 |
| D0 | 00 | 00 | 00 | 00 | 00 | 00 | 00 | 00 | 00 | 00 | 00 | 00 | 00 | 00 | 00 | 00 |
| E0 | 00 | 00 | 00 | 00 | 00 | 00 | 00 | 00 | 00 | 00 | 00 | 00 | 00 | 00 | 00 | 00 |
| F0 | 00 | 00 | 00 | 00 | 00 | 00 | 00 | 00 | 00 | 00 | 00 | 00 | 00 | 00 | 00 | 00 |

CHARACTER CODE CONVERSION UNIT

BACKGROUND OF THE INVENTION

1. Field of the Invention

The present invention relates to a character code conversion unit for converting the code system of character data.

In developing software in recent years, it is a generally accepted practice to manage the source files and the text files as a common file on a network. In this case, when an apparatus (or a system) having a different character code system exists on the network, and when the apparatus that uses a character code system different from that of the common file on the network makes reference to, or updates, the contents of the file, the common file cannot be effectively utilized unless the data are processed by taking the character code system into consideration. It has therefore been desired to reliably effect the code conversion without developing errors when the data are input to, or output from, the apparatus that operates on a code system which is different from that of the common file.

2. Description of the Related Art

Figure 1:
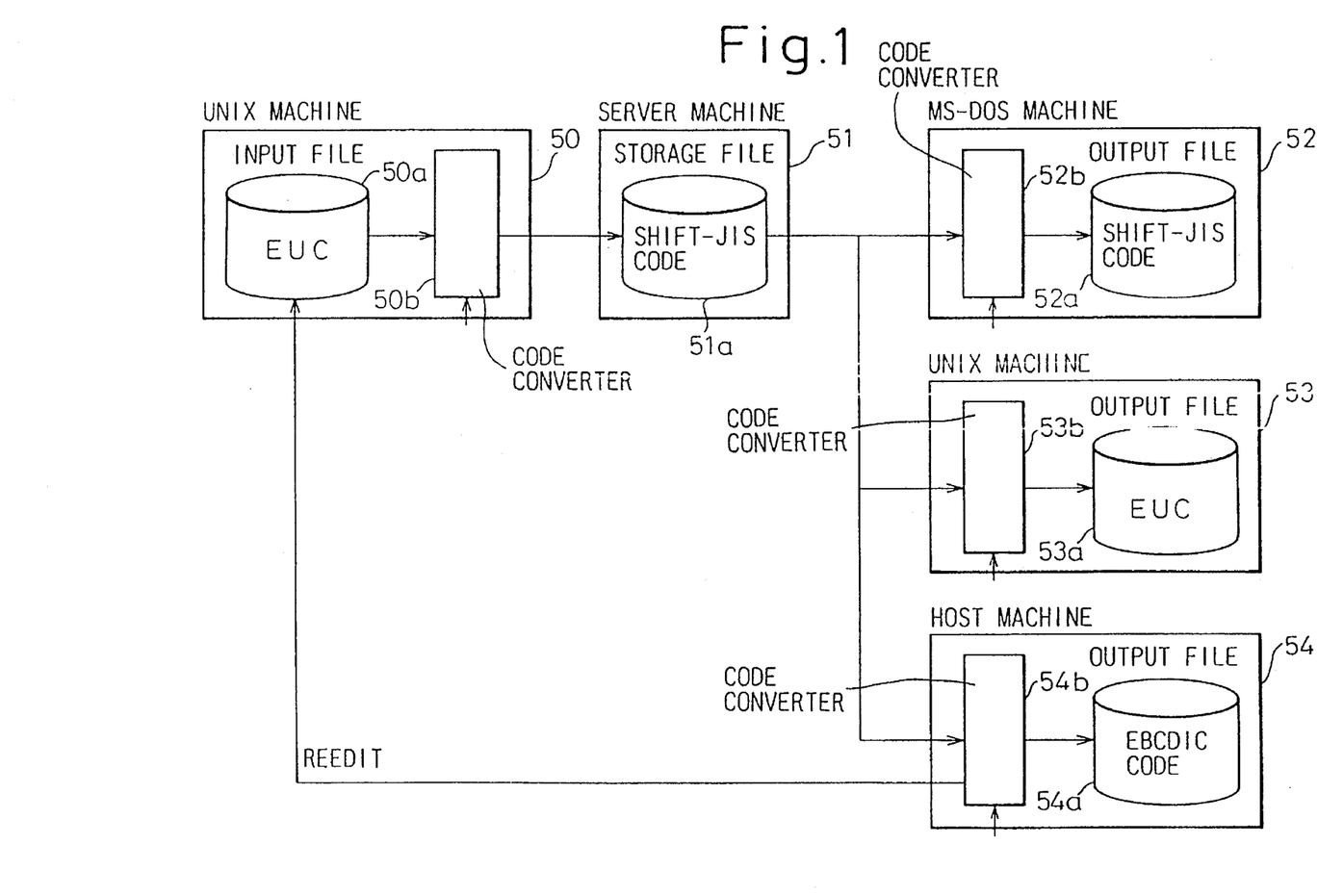
FIG. 1 is an explanatory block diagram showing an example of a related art.

The related art is explained hereinafter with reference to FIG. 1. In the example of FIG. 1, a plurality of kinds of machines (data processors, such as microcomputers or systems) are connected to a server machine through a network such as a LAN (local area network).

In FIG. 1, reference numeral 50 denotes a UNIX machine (registered trademark of X/Open Company Limited) which uses EUC (extended Unix code) as the character code, 51 denotes a server machine equipped with a storage file 51a (common file) of a character code common to all of the machines, 52 denotes an MS-DOS machine (registered trademark of Microsoft Corporation) which uses a SHIFT-JIS (Japanese Industrial Standard) code and is equipped with an output file 52a of the SHIFT-JIS code, 53 denotes a UNIX machine which uses the EUC code and is equipped with an output file 33a of this code, and reference numeral 54 denotes a host machine which uses an EBCDIC (extended binary-coded decimal interchange code) and is equipped with an output file 54a of this code.

The server machine 51 is provided with a storage file 51a, so that the source file and the text file can be managed as a common file by the machines on the network. Each machine makes reference to the storage file 51a and updates the data. However, a machine that uses a code different from the code system of the storage file 51a must convert the code which is input thereto a code which is adapted for use thereby, every time the data is input.

The character code of the storage file 51a of the server machine 51 is selected to be a code which is efficient for the machines on the network. In this example, the code of the storage file 51a is presumed to be the SHIFT-JIS code.

In FIG. 1, when the input file 50a created by the UNIX machine 50 is to be stored in the storage file 51a of the server machine 51, the user must designate, to the code converter 50b, the SHIFT-JIS code which is a code system of the server machine 51, as a converted output data of the code converter 50b. The data created by using the EUC code of the input file 50a, relying upon the code conversion operation, is converted into a SHIFT-JIS code and is stored in the storage file 51a of the server machine 51.

The data input from the UNIX machine 50 and stored in the storage file 51a can be referred to and updated by the other machines 52 to 54 via the network.

When the MS-DOS machine 52 makes reference to the storage file 51a, access is made to the server machine 51 via the network to take out the data. In this case, the user of the MS-DOS machine 52 is aware that the server machine 51 and the user's machine are using the same SHIFT-JIS code. Therefore, the user so designates that the conversion operation will not be carried out by the code converter 52b, and the data read out from the storage file 51a are stored in the output file 52a.

On the other hand, when the host machine 54 accesses the storage file 51a in the server machine 51 to take out the data, the user of the host machine 54 designates the SHIFT-JIS code as an input code to the code converter 54b. The code converter 54b then converts the data from the storage file 51a into the EBCDIC code.

However, the EBCDIC code includes a plurality of systems such as kana, English small letter, ASCII (American Standard Code for Information Interchange), and the code may often be overlapped (i.e., the same code represents different letters) making the conversion impossible. In this case, the code converter 54b finds that the conversion is impossible, and an error message is displayed stating that reediting is necessary. When this error message is displayed, the user of the UNIX machine 50, who has created the input file, reedits the content of the input file 50a so that it can be converted into the EBCDIC code (for example, tries not to use English small letters).

The foregoing has described an example where the data were input to the server machine 51 from the UNIX machine 50, and the data were output from the server machine 51 to the machines 52 to 54. However, the same operation is carried out even when the data are input to the server machine 51 from the machines 52 to 54 or the data are output from the server machine 51 to other machines. Therefore, each machine is provided with both a code converter (e.g., 50b) for use at the time of input and a code converter (e.g., 52b) for use at the time of output.

According to the above-mentioned prior art, the user of the machine must designate an input code (code of data to be input) through a short arrow when the data is to be input to the code converter and must designate an output code (converted character code) through a short arrow when the data is to be output, requiring cumbersome operations and leaving a chance of erroneous designations.

Moreover, no error occurs when the EUC code of the UNIX machine 50 of FIG. 1 is stored in the storage file 51a of the server machine 51, but a conversion error occurs for the first time when access is made to the storage file 51a from the host machine 54. On the side of the machine inputting the data, therefore, additional processing must be carried out such as reediting the conversion error that has occurred later. Moreover, reliability for the storage file is lost since it is not certain when an error would occur while converting the data in the storage file 51a into various codes.

SUMMARY OF THE INVENTION

The object of the present invention is to provide a character code conversion unit which so inputs the data into a common file that a conversion error will not occur even when a code used by a file stored in the common file is converted into another code, as well as to provide a character code conversion unit which works to properly convert the code at the time of inputting data to the common file that uses a different code system, as utilized by a plurality of systems (data processors) connected through a network, without the need of designating the code conversion.

According to a first aspect of the present invention, there is provided a character code conversion unit for converting character data expressed by a first code system into character data expressed by a second code system, comprising a code converter which inputs the character data of the first code system, converts the inputted character data into character data of the second code system, and holds the converted results when they are properly converted; and a unit for determining the conversion into another character code system, which inputs the character data of the first code system, and determines whether the data can be converted into the data of a third code system, different from the data of the first code system and the second code system. The converted results held in the code converter are output when the data can be converted into the data of the third code system.

It is desired that the unit for determining the conversion into another character code system works to determine whether the first code can be converted into a plurality of other code systems that have been set in advance as a third code system.

According to a second aspect of the present invention, there is provided a character code conversion unit in a file system in which a plurality of data processors that use character data of different code systems make access to a common file constituted by the character data of a second code system to utilize it, wherein each of the plurality of data processors comprises a code converter which inputs the character data of a first code system used by the data processors, converts the character data into character data of the second code system, and holds the converted results when they are properly converted; and a unit for determining the conversion into another character code system which inputs the data of the first code system, and determines whether the data can be converted into the data of a third code system different from the data of the first code system and the second code system. The converted results held in the code converter are output to the common file.

It is desired that the common file holds control data expressing the code system of the common file and the code system used by the plurality of data processors that utilize the file system, that each of the data processors take out the control data from the common file, and the code converter and the unit for determining the conversion into other character code system effect the conversion and determine the conversion relying upon the control data.

It is further desired that the code converter effects the conversion upon receiving the second code designated by an external unit, and the unit for determining the conversion into another character code system determines the conversion upon receiving the third code designated by an external unit.

Other features and advantages of the invention will become apparent from the following description with reference to the accompanying drawings.

DESCRIPTION OF THE PREFERRED EMBODIMENTS

Prior to describing the embodiment of the present invention, an outline of the present invention will be given with reference to FIG. 2.

Figure 2:
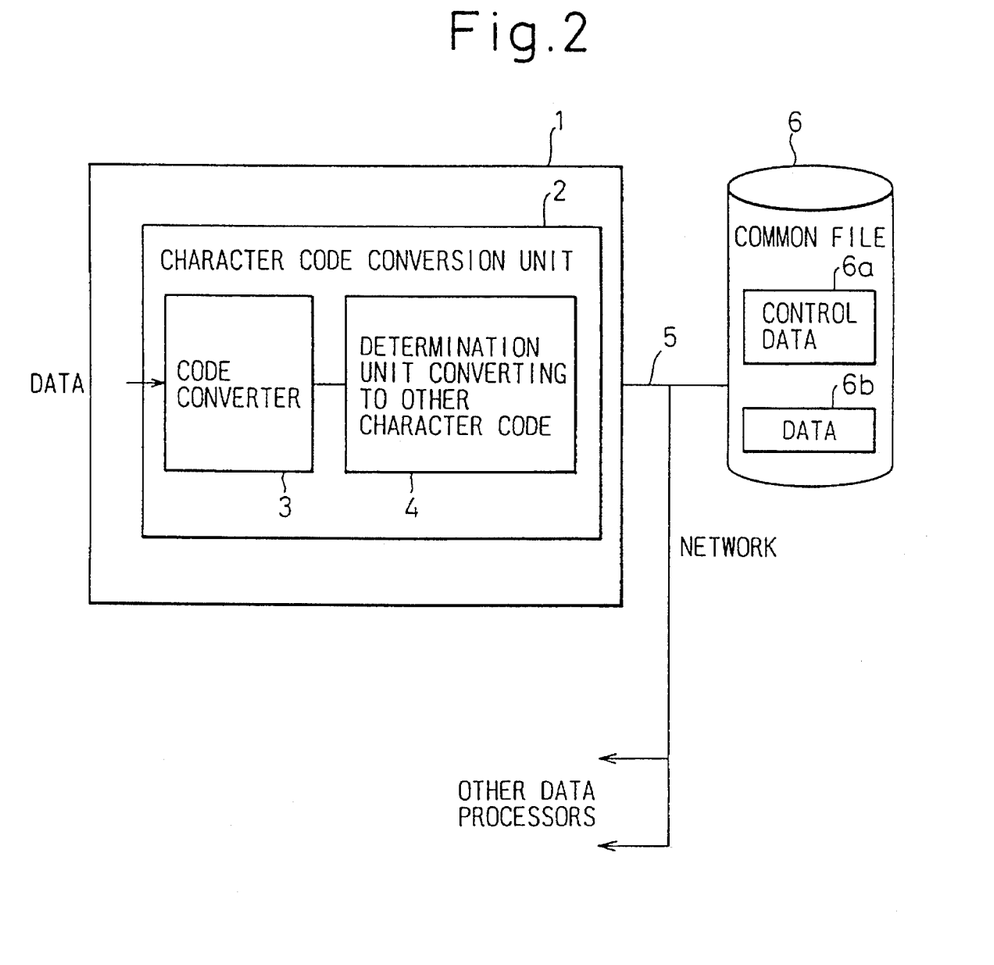
FIG. 2 is a simplified block diagram of the present invention.

In FIG. 2, reference numeral 1 denotes a data processor connected to a network; 2 denotes a character code conversion unit; 3 denotes a code converter which converts a first code (original character code) used by the data processor 1 into a second code (converted character code) used by a common file and stores the converted results; 4 denotes a unit for determining the capability of correct conversion into another character code system and which determines whether an error has not occurred when the second code is converted into a third code (i.e., a third code as used by other data processors connected to the network) other than the second code; 5 denotes a network; 6 denotes a common file; 6a denotes control data including character code information of the second code used by the common file and a code (third code) used by the data processors; and 6b denotes data input to, and output from, the data processors.

According to the present invention, the first code used by the apparatus is converted into the second code used by the common file and so will not develop an error, and is held at the time of converting the character code of the input data, and then, the conversion into the third code, other than the first code or the second code, is executed as a dummy (i.e., the converted result is not actually used) to determine whether or not an error develops. Then, when there is no error, the content converted into the second code is output to the common file.

To input the data of the first code created or updated by the data processor 1 to the common file 6, access is made to the common file 6 to take out the control data 6a, whereby there is obtained character code information of the code (second code) of the common file and the code (third code or, often, a plurality of codes) used by other data processors connected to the network. Among them, the data indicating the kind of the code (second code) of the common file is sent as a control signal to the code converter 3, and the data indicating the kind of code (third code) of other data processors is sent, as a control signal for determining the conversion, to the unit 4 that determines the conversion into another character code system.

Therefore, the input data is converted by the code converter 3 from the first code into the second code, and the converted result is stored. When the conversion is favorably carried out, the unit 4 for determining the conversion into another character code tentatively effects the conversion into the third code other than the first code and the second code (but does not hold the converted result) and determines whether or not a conversion error occurs. In this case, the third code is the code of the other data processors that utilize the common file 6, i.e., is the code other than the first code and the second code and may often consist of a plurality of codes.

When no error has occurred as determined by the unit 4 for determining the conversion to another character code system, the converted result by the code converter 3 is output to the common file 6. When an error has occurred in the code converter 3 or in the unit 4 for determining the conversion into another character code system, reediting is carried out by the data processor 1. The second code, set as a code to be used by the common file 6, is designated to the code converter 3. In this case, the third code is the code of other data processors that utilize the common file 6 and is a code other than the first code and the second code. When no error has occurred as determined by the unit 4 for determining the conversion into another character code system, the converted result by the code converter 3 is output to the common file 6.

In the above description, the kinds of the converted character codes (second code and third code) sent to the code converter 3 and the unit 4 for determining conversion into another character code system in the character code conversion unit 2 were designated by the common file 6. However, they may be designated by the user.

When the data of the common file 6 are to be referred to by other data processors that use the third code, access is made to the common file 6, the kind of code of the common file is obtained from the control data 6a and is fed as a control signal for the code converter (not shown) to effect the conversion for the data 6b. In this conversion, no conversion error occurs since it has been checked by the unit 4 for determining the conversion into other character code system while the data 6b are being stored.

An embodiment of the present invention will now be described with reference to FIG. 3A and FIG. 3B.

In this embodiment, the present invention is adapted to a generation management system in which a generation management file is commonly used by a plurality of data processors, such as personal computers, and host equipment having different code systems.

Figure 3A:
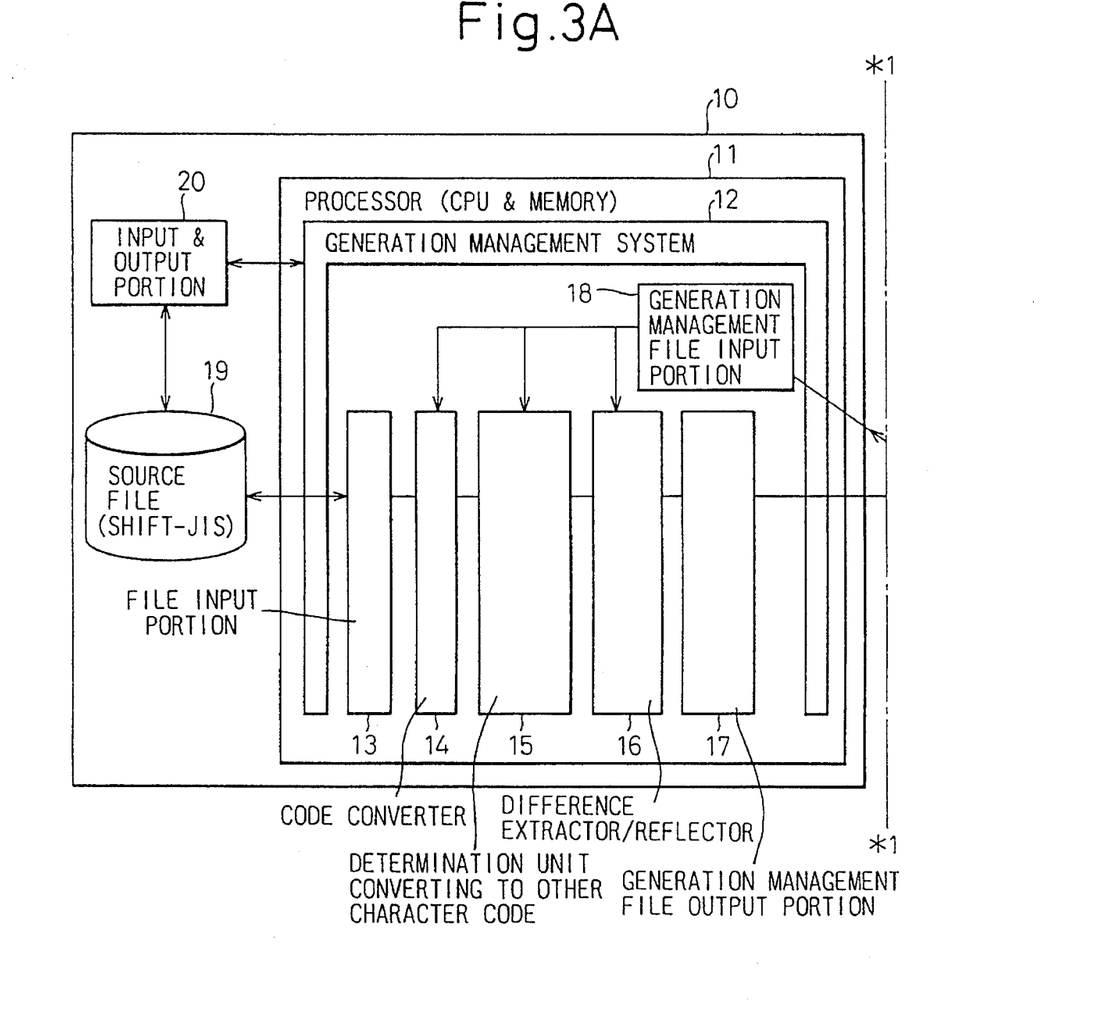
FIG. 3A and FIG. 3B are a block diagram showing a generation management system according to an embodiment of the present invention.
Figure 3B:
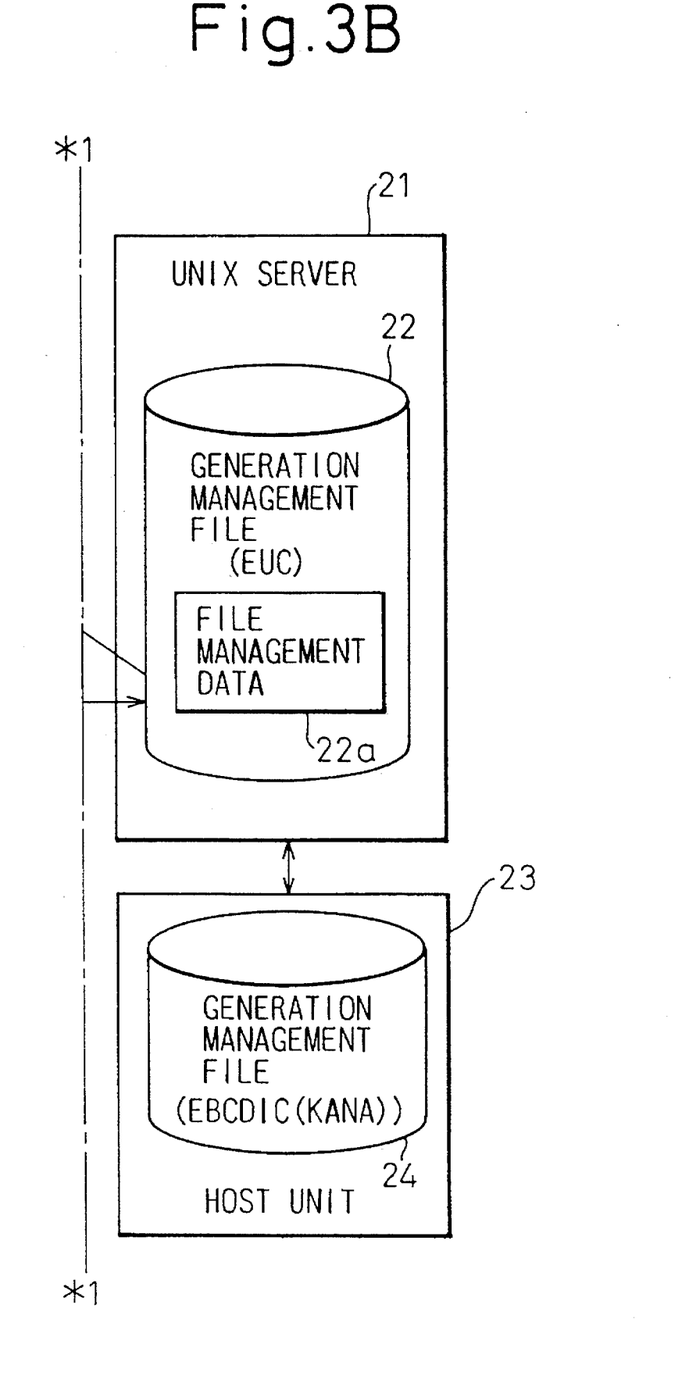

In FIG. 3A and FIG. 3B, reference numeral 10 denotes a data processor such as personal computer that uses the SHIFT-JIS code; 11 denotes a processor (CPU and memory); 12 denotes a generation management system that operates in the processor 11; reference numeral 13 denotes a file input portion; 14 denotes a code converter; 15 denotes a unit for determining conversion to another character code system; 16 denotes a difference extractor/reflector; 17 denotes a generation management file output portion, or unit; 18 denotes a generation management file input portion, or unit; 19 denotes a source file expressed by the SHIFT-JIS code that includes a content updated by the data processor 10; reference numeral 20 denotes an input/output portion, or unit including a display unit and an input portion; 21 denotes a UNIX server that uses the EUC code; 22 denotes a generation management file of the EUC code provided as a common file; 23 denotes a host unit; and reference numeral 24 denotes a generation management file written in the EBCDIC (kana-Japanese phonetic symbols) code. In the constitution of this embodiment, the code converter 14 and the unit 15 for determining the conversion into another character code system correspond to those having the same names and designated as 3 and 4 in FIG. 1.

The data processor 10, host unit 23 and UNIX server 21 are connected to one another through a network such as a LAN, and to which are further connected a plurality of other data processors (e.g., personal computers using the EUC code of UNIX).

In the generation management file 22 are stored a code (storage code) used in the UNIX server 21 and data representing the code used by the units (data processor 10, host unit 23, etc.) connected through the network as file management data 22a (corresponds to 6a of FIG. 2).

In this system, the data processor 10 is used as a terminal for developing software, UNIX server 21 is provided as a resource storage, management is carried out by using the file in common, and the processing is executed by transferring the resource storage to the host unit 23. In this network, there exist three kinds of code sequences, i.e., SHIFT-JIS code, EUC and EBCDIC (there are three systems, i.e., kana system, English small letter system and ASCII system, but the code of the kana system is used here). Therefore, the generation management file must be capable of converting the data into three kinds of code systems. From the standpoint of utilization efficiency, the generation management file (common file) 22 of the UNIX server 21 uses the EUC code that is adapted to the terminal of UNIX.

The generation management file 22 is a history file, and returning incorrect data, due to code conversion error at the time of taking out the data, could become a cause of interrupting the normal history management. At the time of storing the file, therefore, the processing is executed by using the code converter of the present invention.

When the file created as a source file 19 is stored in the data processor 10, the content is reflected in the generation management file 22 of the UNIX server 21 and is updated. Described below is the operation inclusive of code conversion at this moment.

First, the generation management file input portion, or unit 18 reads the generation management file 22 from the UNIX server 21 while being controlled by the generation management system 12. At this moment, the file management data 22a of the generation management file 22 are read out together with the content of the file and are input to the generation management file input portion 18. The generation management file input portion 18 sends a signal representing the EUC code, which is the storage code (code of the generation management file 22), as an input converted character code to the code converter 14 and sends a signal representing the code (EBCDIC kana code) of the host unit 23 as a code to be determined, to the unit 15 that determines conversion to another character code system.

Next, the generation management system 12 reads the source file 19. The file that is read out is input by the file input portion 13 to the code converter 14 where the file of the SHIFT-JIS code is converted into the EUC code. After the above conversion or in parallel with the operation of the code converter 14, the unit 15 for determining the conversion to another character code determines whether the file of the SHIFT-JIS code from the file input portion 13 can be converted into the EBCDIC (kana system) code or not (whether error has occurred due to conversion or not).

When error has occurred due to the operation of the code converter 14 and the unit 15 for determining conversion to another character code system, an error message is displayed on the input/output portion 20 to promote the reediting of the source file. In this case, the reediting is executed and the operation is carried out to so correct the characters such that an error will not occur.

When no error is caused by the operation of the code converter 14 and the unit 15 for determining conversion into another character code system, the converted result of the code converter 14 is input to the difference extractor/reflector 16. The difference extractor/reflector 16 executes the processing for managing the generation, picks up the difference between the data of the generation management file 22 before the reflection input from the generation management file input portion 18 and the updated data (i.e., the data converted into the EUC code) from the source file (reflection file) 19, the and different portions (i.e., the difference between the file before updating and the file after updating) are replaced by the data of the source file 19 to execute the reflection and updating. The updated data are output from the generation management file output unit 17 to the UNIX server 21, and are stored in the generation management file 22 together with the history data.

Figure 4:
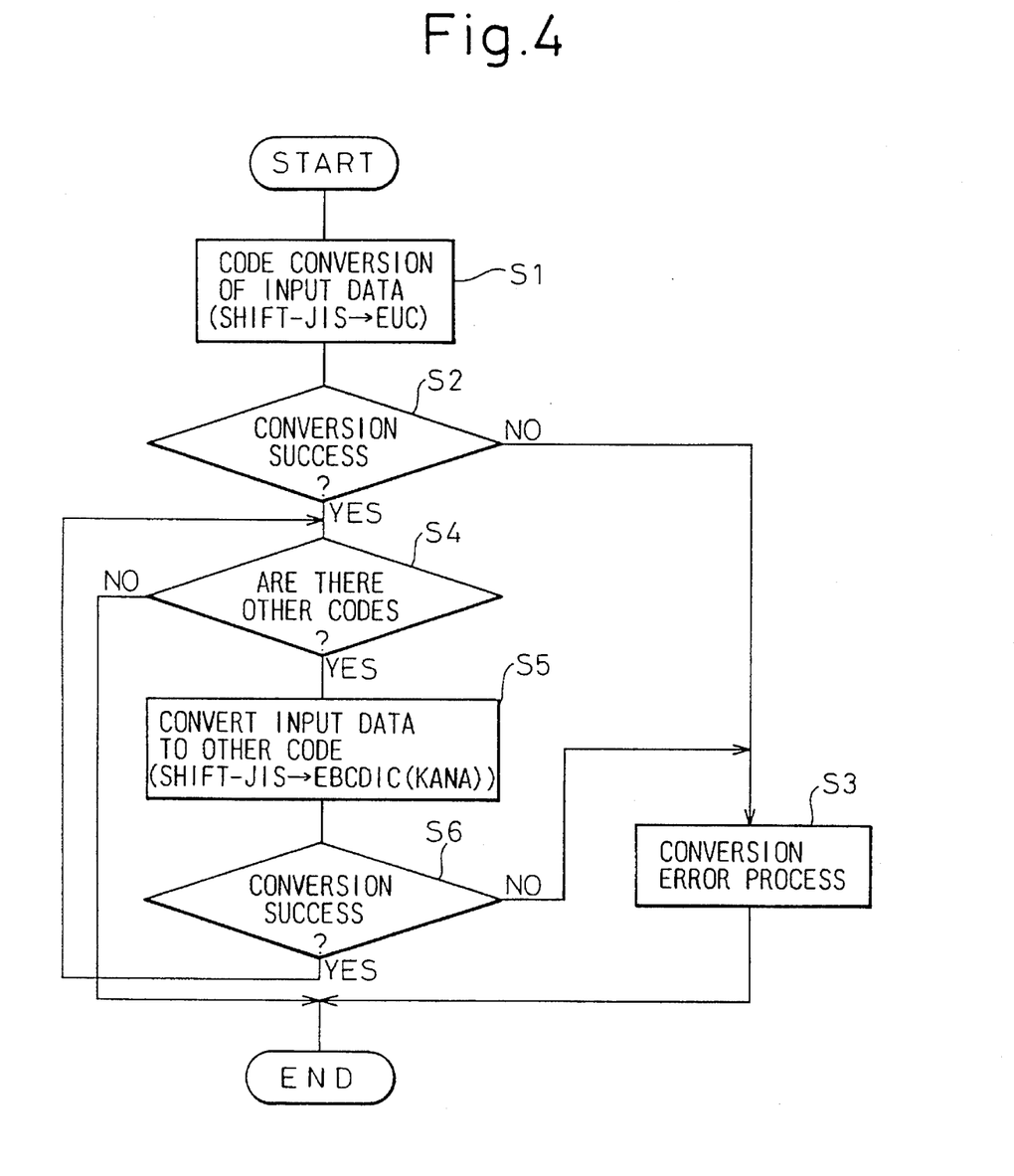
FIG. 4 is a flow-chart of the processes in the embodiment of FIG. 3.

FIG. 4 is a diagram illustrating the process flow of the code converter and the unit for determining conversion into other character code system, which is executed by the constitution of FIG. 3A and FIG. 3B. In FIG. 4, first, the input data is converted by the code converter into the EUC, which is the code of the UNIX server (S1 in FIG. 4). It is determined whether the conversion is successful (S2). When error occurs in the code conversion, reediting of the source file 19 is promoted (S3). Concretely speaking, the input/output portion 20 of FIG. 3A and FIG. 3B displays a message indicating the occurrence of conversion error on the display portion (not shown) of the data processor.

When the conversion is successful, it is determined whether there is any other code system on the network (S4). When there is no other code system, the processing is finished.

In this example, the code of EBCDIC (kana system) has been designated as the code of the host unit, and the unit for determining conversion into other character code system converts the EUC into the EBCDIC (kana system) code (S5). It is determined at this moment whether the conversion is successful (S6). When an error has occurred, the conversion error processing is carried out in the same manner as in the above-mentioned step S3. When the conversion is successful, the processing of the code conversion is finished.

The code conversion by the code converter 14 and by the unit 15 for determining conversion into another character code system explained in the above embodiment is executed by using a conversion table in which is stored the character code of the converted character code system that corresponds to the character code of the original character code system.

Figure 5:
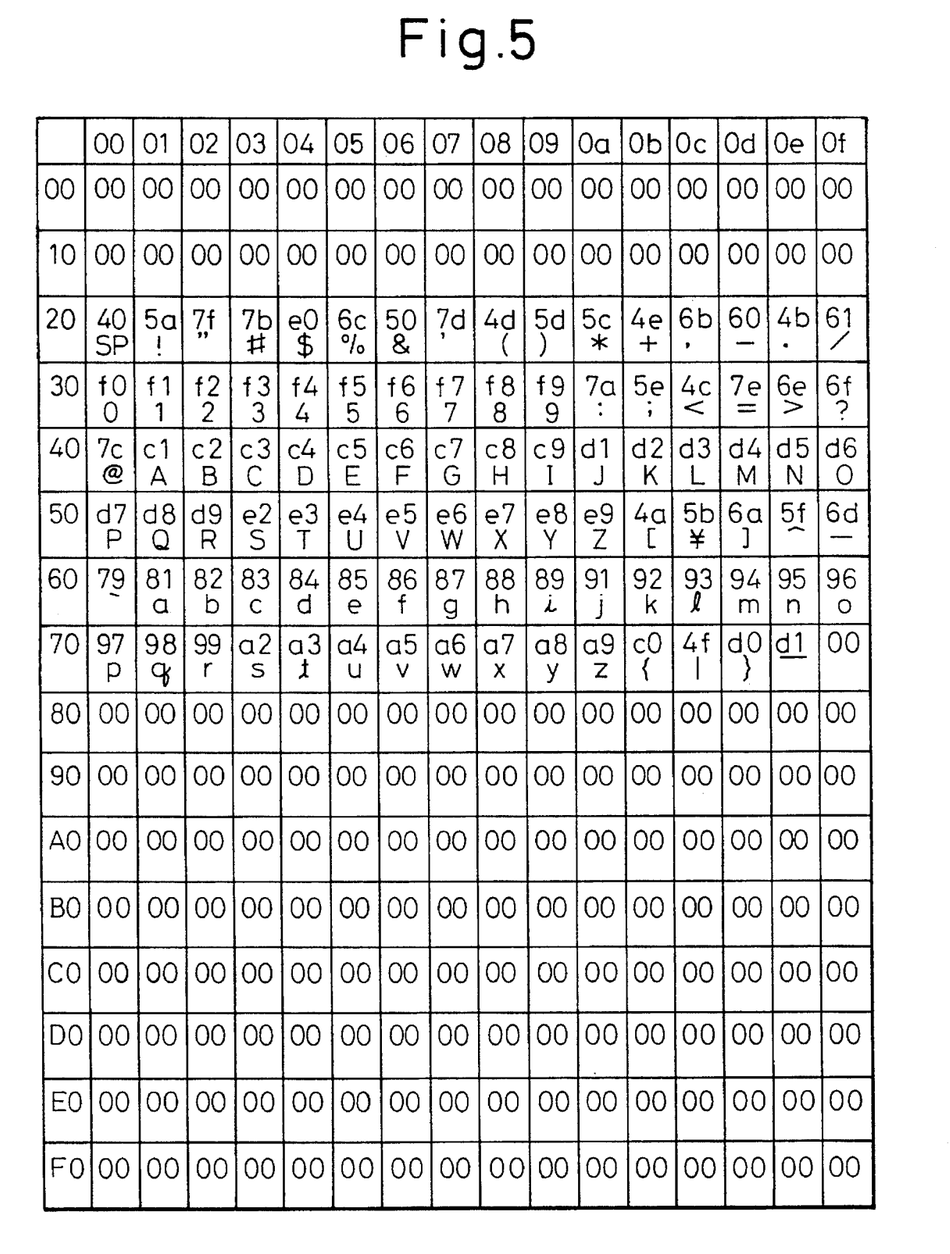
FIG. 5 is an explanatory diagram showing an example of the conversion table.

FIG. 5 is a diagram which concretely illustrates the conversion table.

The conversion table shown in FIG. 5 is used for the code conversion by using one byte of ASCII (different from the ASCII system of EBCDIC) as the original code and using one byte of EBCDIC (English small letter system) as the converted code. The principle holds true even for the combination of another original character code and the converted character code.

When the conversion is to be effected by making reference to the conversion table of FIG. 5, the first 4 bits of a character (consisting of a total of 8 bits) by the ASCII code represent the position of the row (00, 10, 20, - - -, F0), and the latter 4 bits represent the position of the column (00, 01, 02, - - - ,) and at the crossing point of the two indicates a character (inclusive of symbols) represented by the character code and a conversion code thereof. For instance, when the first 4 bits of the ASCII code represent "6" (hexadecimal notation) and the latter 4 bits represent "1" (hexadecimal notation), it is a code of character "a" at an intersecting point of a row represented by "60" and a column represented by "01" in Table 1, from which it will be understood that the code of the EBCDIC (English small letter) system of the character is "81" (hexadecimal notation) that is displayed together with the character "a". When "00" is stored at a position where the converted character code is displayed in the conversion table of FIG. 5, it means that the code corresponding to the original character does not exist in the converted character code. Therefore, a conversion error results when the code "00" is detected.

According to the present invention, not only is the conversion error detected in converting the code of the data from the original character code to the converted character code but also it is possible to check whether the code can be converted into the third code. Therefore, no conversion error is generated when the data converted into the second code are taken out by a unit that uses the third code.

The present invention makes it easy to create a source text without the need of taking the character code into consideration when a common program is to be developed using a plurality of data processors having different character codes or when a common file is to be utilized. Moreover, when use is made of a character code other than those used by the data processors, the character code to be used is designated to carry out the operation in the same manner as the operation using the character code of the apparatus.

When the data are taken out after the data that have been code-converted are stored in the common file of the file system, no error occurs, such as character misinterpretation or conversion failure. This eliminates the need of inputting the source text again and helps improve the efficiency in the developing operation by utilizing a plurality of systems having different character codes.

I claim:

1. A character code conversion unit for converting character data expressed by a first code system into character data expressed by a second code system, comprising:

a code converter which inputs the character data of the first code system, converts the inputted character data into character data of the second code system, and holds the converted results when they are properly converted; and a unit for determining the conversion into another character code system, which unit inputs the character data of said first code system and determines whether the character data input therein can be converted into the data of a plurality of other code systems that have been set in advance as a third code system and which third system code data is different from the respective data of both said first code system and said second code system, said code converter outputting the converted results, held in the code converter, when the data can be converted into the data of the third code system.

2. A character code conversion unit in a file system in which a plurality of data processors, that use character data of respective, different code systems, make access to a common file constituted by the character data of a second code system to utilize it, each of said plurality of data processors comprising:

a code converter which inputs the character data of a first code system used by the data processors, converts the inputted character data into character data of the second code system and holds the converted results when they are properly converted; and a unit for determining the conversion into another character code system, which unit inputs the character data of said first code system and determines whether the character data input therein can be converted into the data of a third code system which is different from the respective data of said first code system and said second code system, said code converter outputting converted results, held in said code converter, to the common file.

3. A character code conversion unit according to claim 2, wherein:

said common file holds control data expressing the code system of the common file and the code system used by the plurality of data processors that utilize the file system;

each of the data processors takes out the control data from the common file; and the code converter and the unit for determining the conversion into another character code system effect the conversion and determine the conversion, relying upon the control data.

4. A character code conversion unit according to claim 2, wherein:

said code converter effects the conversion upon receiving the second code designated by an external unit; and said unit for determining the conversion into another character code system determines the conversion upon receiving the third code designated by an external unit.

* * * * *

UNITED STATES PATENT AND TRADEMARK OFFICE
CERTIFICATE OF CORRECTION

PATENT NO. : 5,479,167
DATED : Dec. 26, 1995
INVENTOR(S) : MURAKAMI

It is certified that error appears in the above-indentified patent and that said Letters Patent is hereby corrected as shown below:

Col. 7, line 1, change "the and" to --and the--;

Signed and Sealed this

Thirtieth Day of July, 1996

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,479,167
DATED : Dec. 26, 1995
INVENTOR(S) : MURAKAMI

It is certified that error appears in the above-indentified patent and that said Letters Patent is hereby corrected as shown below:

Col. 7,
    line 55, after "02, - - -," insert --Of-- and delete "at".

Signed and Sealed this

Fifteenth Day of October, 1996

Attest:

BRUCE LEHMAN

*Attesting Officer*      *Commissioner of Patents and Trademarks*